United States Patent
Liao et al.

(10) Patent No.: US 6,534,331 B2
(45) Date of Patent: Mar. 18, 2003

(54) METHOD FOR MAKING A VERTICAL-CAVITY SURFACE EMITTING LASER WITH IMPROVED CURRENT CONFINEMENT

(75) Inventors: Andrew Shuh-Huei Liao, San Jose, CA (US); Ghulam Hasnain, Palo Alto, CA (US); Chihping Kuo, Milpitas, CA (US); Hao-Chung Kuo, San Jose, CA (US); Zhiqing Shi, San Jose, CA (US); Minh Ngoc Trieu, San Jose, CA (US)

(73) Assignee: LuxNet Corporation, Fremont, CA (US)

( * ) Notice: Subject to any disclaimer, the term of this patent is extended or adjusted under 35 U.S.C. 154(b) by 0 days.

(21) Appl. No.: 09/912,803

(22) Filed: Jul. 24, 2001

(65) Prior Publication Data

US 2003/0022406 A1 Jan. 30, 2003

(51) Int. Cl.[7] ................................................. H01L 21/00
(52) U.S. Cl. ............................ 438/46; 438/29; 438/45; 372/45; 372/48; 372/50
(58) Field of Search ........................... 438/29, 45, 464; 372/45, 50, 98

(56) References Cited

U.S. PATENT DOCUMENTS

| | | | |
|---|---|---|---|
| 4,949,350 A | | 8/1990 | Jewell et al. |
| 5,115,442 A | | 5/1992 | Lee et al. |
| 5,245,622 A | * | 9/1993 | Jewell et al. |
| 5,256,596 A | | 10/1993 | Ackley et al. |
| 5,328,854 A | * | 7/1994 | Vakhshoori et al. |
| 5,337,327 A | | 8/1994 | Ackley |
| 5,348,912 A | | 9/1994 | Choquette et al. |
| 5,359,618 A | | 10/1994 | Lebby et al. |
| 5,373,522 A | | 12/1994 | Holonyak, Jr. et al. |
| 5,446,752 A | | 8/1995 | Ackley et al. |
| 5,493,577 A | | 2/1996 | Choquette et al. |
| 5,719,891 A | | 2/1998 | Jewell |
| 5,774,487 A | | 6/1998 | Morgan |
| 5,896,408 A | | 4/1999 | Corzine et al. |
| 5,903,589 A | | 5/1999 | Jewell |

(List continued on next page.)

OTHER PUBLICATIONS

Y.H. Lee et al—"Top Surface Emitting GaAs Four–Quantum–Well Lasers Emitting AT 0.85um" Electronics Letters vol. 26, No. 11 (1990) 710–711.

Huffaker, D.L. Shin, J. and Deppe, D,G, et al—"Improved Mode Stability in Low Threshold Single Quantum Well Native–Oxide Defined Vertical–Cavity Lasers", Appl. Phys Lett. 65 (Nov. 21, 1994); 2642–2644.

Huffaker, D.L. Shin, J. and Deppe, D.G.—"Low Threshold Half–Wave Vertical–Cavity Lasers", Electron. Lett. 30, (Nov. 10, 1994); 1946–1947.

Choquette,K.D., Schneider, R.P., Lear, K.L., et al—"Low Threshold voltage vertical–cavity lasers fabricated by selective oxidation," Electronics Letters vol. 30, No. 24 (Nov. 24, 1994) 2043–2044.

(List continued on next page.)

Primary Examiner—Long Pham
(74) Attorney, Agent, or Firm—Calvin B. Ward

(57) ABSTRACT

A current confinement element that can be used in constructing light-emitting devices. The current confinement element includes a top layer and an aperture-defining layer. The top layer includes a top semiconducting material of a first conductivity type that is transparent to light. The aperture-defining layer includes an aperture region and a confinement region. The aperture region includes an aperture semiconducting material of the first conductivity type that is transparent to light. The confinement region surrounds the aperture region and includes a material that has been doped to provide a high resistance to the flow of current. The aperture-defining layer is constructed by implanting or diffusing elements into one or more of the mirror layers prior to depositing the remaining mirror layers on top of the aperture-defining layer.

8 Claims, 4 Drawing Sheets

U.S. PATENT DOCUMENTS

| | | | | |
|---|---|---|---|---|
| 5,903,590 | A | | 5/1999 | Hadley et al. |
| 5,940,422 | A | | 8/1999 | Johnson |
| 6,011,811 | A | * | 1/2000 | Ohlander et al. |
| 6,014,395 | A | | 1/2000 | Jewell |
| 6,075,804 | A | | 6/2000 | Deppe et al. |
| 6,144,682 | A | * | 11/2000 | Sun |
| 6,160,830 | A | | 12/2000 | Kiely et al. |
| 6,169,756 | B1 | | 1/2001 | Chirovsky et al. |
| 6,277,696 | B1 | * | 8/2001 | Carey et al. |
| 6,356,571 | B1 | * | 3/2002 | Kiely et al. |
| 6,359,919 | B1 | * | 3/2002 | Ishikawa et al. |

OTHER PUBLICATIONS

MacDougal, M. H., et al—"Ultralow Threshold Current Vertical–Cavity Surface–Emitting Lasers with AlAs–oxide–GaAs Distributed Bragg Reflectors," IEEE photonics Technology Lett. vol.; 7 (Mar. 1995); 229–231.

Hayashi, Y. Mukaihara, T., Hatori, N., et al—"Record low–threshold index guided InGaAs/GaAlAs vertical–cavity surface emitting laser with a native oxide confinement structure," Electronics Letters vol. 31, No. 7 (Mar. 30, 1995); 560–562.

Lear, K.L., Choquette, K.D., Schneider, R.P., et al—"Modal analysis of a small surface emitting laser with a selectively oxidzed waveguide," Appl. Phys. Lett. vol. 66, No. 20 (May 15, 1995); 2616–2618.

Yang, G.M., MacDougal, M.H., and Dapkus, P.D.–"Ultralow threshold current–vertical cavity surface–emitting lasers obtained with selective oxidation," Electronics Letters vol. 31, No. 11 (May 25, 1995); 886–888.

Choquette, Kent D., Lear, K.L., Scheider, R.P., et al—"Cavity characteristics of selectively oxidized vertical–cavity lasers", Appl. Phys. Lett. vol. 66, No. 25 (Jun. 19, 1995); 3413–3415.

Li, G.S., Lim, S.F., Yuen, W., et al—"Polarisation and modal behaviour of low threshold oxide and airgap confined vertical–cavity lasers," Electronics Letters, vol. 31, No. 23 (Nov. 9, 1995); 2014–2015.

Coldren, L.A., Thibeault, B.J., Hegblom, E.R. et al—"Dielectric apertures as intracavity lenses in vertical–cavity lasers", Appl. Phys. Lett. vol. 68, No. 3 (Jan. 15, 1996); 313–315.

Floyd, P.D., Thibeault, B.J., Coldren, L.A. et al—"Scalable etched–pillar, AlAs–oxide defined vertical–cavity lasers", Electronics Letters Vol. 32, No. 2 (Jan. 18, 1996); 114–116.

Lear, K.L., Mar., A., Choquette K.D., et al—"High frequency modulation of oxide–confined vertical–cavity surface emitting lasers," Electronics letters vol. 32, No. 5 (Feb. 29, 1996); 457–459.

Weigl, B., Grabherr, M., Reiner, G., et al—"High efficiency selectively oxidised MBE grown vertical–cavity surface–emitting lasers," Electronics Letters vol. 32, No. 6 (Mar. 14, 1996); 557–559.

Ochiai, M., Guidice, G.E., Temkin, H., et al—"Kinetics of thermal oxidation of AlAs in water vapor," Appl .Phys. Lett. vol. 68 No. 14 (Apr., 1996); 1898–1900.

Huffaker, D.L., Deppe, D.G., Lei, C., et al—"Sealing AlAs agalinst oxidative decomposition and its use in device fabrication," Appl. Phys. Lett. vol. 68 No. 14(Apr. 1996); 1948–1950.

Deng, H. and Deppe, D.G.—"Oxide–confined vertical–cavity laser with additional etched void confinement," Electronics Letters vol. 32, No. 10 (May 9, 1996); 900–901.

Choquette, Kent D., Chow, W.W., Hagerott Crawford, M., et al–"Threshold investigation of oxide–confined vertical–cavity laser diodes," Appl .Phys. Lett. vol. 68, No. 26 (Jun. 24, 1996); 3689–3691.

Twesten, R.D., Follstaedt, D.M., Choquette, K.D., et al—"Microstructure of laterally oxidized AlxGa1–xAs layers in vertical–cavity lasers", Appl .Phys. Lett. vol. 69 No. 1 (Jul. 1, 1996); 19–21.

Schneider, R.P., Tan, M.R.T., Corzine, S.W., et al—"Oxide confined 850 nm vertical–cavity lasers for multimode–fibre data communications," Electronics Letters vol. 32, No. 14 (Jul. 4, 1996); 1300– 1302.

Grabherr, M., Weigl, B., Reiner, G., et al—"High power top surface emitting oxide confined vertical–cavity laser diodes," Electronic Letters vol. 32, No. 18 (Aug. 29, 1996); 1723–1724.

Choquette, Kent D., Geib, K.M., Chui, H.C., et al—"Selective Oxidation of buried AlGaAs versus AlAs layers," Appl. Phys. Lett. vol. 69, No. 10 (Sep. 2, 1996); 1385–1387.

Weigl, B., Reiner, G., Grabherr, M., et al—"Oxidised GaAs QW vertical–cavity lasers with 40% power conversion efficiency," Electronic Letters vol. 32, No. 19 (Sep. 12, 1996); 1784–1786.

Yang, Gye Mo, MacDougal, Michael H., and Dapkus, P. Daniel—"Effects of current spreading under oxide current aperture in vertical–cavity surface–emitting lasers," J. Appl .Phys. vol. 80, No. 9(Nov. 1, 1996); 4837–4840.

Oh, T.H., Huffaker, D.L., and Deppe, D.G.—Size effects in small oxide confined vertical–cavity surface–emitting lasers,: Appl .Phys. Lett. vol. 69 No. 21 (Nov. 18, 1996); 3152–3154.

Jung, C., Jager, R., Grabherr, M., et al—"4.8mW singlemode oxide confined top–surface emitting vertical–cavity laser diodes," Electronics Letters vol. 33, No. 21 (Oct. 9, 1997); 1790–1791.

Kim, J.H., Lim, D.H., Kim, K.S., et al—"Lateral wet oxidation of AlxGa1–xAs–GaAs depending on its structures", Appl .Phys. Lett. vol. 69, No. 22 (Nov. 25, 1996) 3357–3359.

Jager, R., Grabherr, M., Jung, C., et al—"57% wallplug efficiency oxide–confined 850 nm wavelength GaAs VCSELs". Electronics Letters vol. 33, No. 4 (Feb. 13, 1997); 330–331.

Choquette, Kent D., Chow, W.W., Hadley, G.R., et al—"Scalability of small–aperture selectively oxidized vertical–cavity lasers," Appl .Phys. Lett. vol. 70 No. 7 (Feb. 17, 1997); 823–825.

Blum, O., Ashby, C.I.H., and Hou, H.Q.—"Barrier layer thickness control of selective wet oxidation of AlGaAs for embedded optical elements," Appl .Phys. Lett. vol. 70 No. 21 (May 26, 1997); 2870–2872.

Choquette, K.D. Hadley, G.R., Hou, H.Q., et al—"Leaky mode vertical cavity lasers using cavity resonance modification," Electronics Letters, vol. 34, No. 10 (May 14, 1998); 991–993.

Ha, K.H., Lee, Y.H. Shin, H.K., et al—"Polarisation anisotropy in asymmetric oxide aperture VCSELs," Electronics Letters, vol. 34, No. 14 (Jul. 9, 1998); 1401–1402.

Liu, G. Seurin, J.F., Chuang, S.L., et al—"Mode selectivity study of vertical–cavity surface emitting lasers," Appl .Phys. Lett. vol. 73, No. 6 (Aug. 10, 1998); 726–728.

Choi, Won–Jin, and Dapkus, P.Daniel—Self–defined AlAs–oxide–current–aperture buried heterostructure vertical–cavity surface–emitting laser,: Appl .Phys. Lett. vol. 73, No. 12 (Sep. 21, 1998); 1661–1663.

Evans, P.W., Wierer, J.J., and Holonyak, N.—"$Al_xGa_{1-x}As$ native–oxide–based distributed Bragg reflectors for vertical cavity surface emitting lasers," J. App .Phys. vol. 84, No. 10 (Nov. 15, 1998); 5436–5440.

L.M.F. Chirovsky et al—"Implant–Apertured and Index–Guided Vertical–Cavity Surface–Emitting Lasers (12–VCSELs)." IEEE PTL vol. 11, No. 5, 500–503 (1999).

G.Dang et al—"High–Speed Modulation of 850 nm Intracavity Contacted Shallow Implant–Apertured Vertical–Cavity Surface–Emitting Lasers." IEEE PTL vol. 13, No. 9, 924–926 (2001).

* cited by examiner

METHOD FOR MAKING A VERTICAL-CAVITY SURFACE EMITTING LASER WITH IMPROVED CURRENT CONFINEMENT

FIELD OF THE INVENTION

This invention relates generally to vertical cavity surface-emitting lasers (VCSELs) and, more particularly, to an improved VCSEL in which the current channeling function utilizes an ion-implanted or diffused aperture region.

BACKGROUND OF THE INVENTION

Semiconductor laser diodes were originally fabricated in a manner that led to a diode structure in which light is emitted parallel to the surface of the semiconductor wafer with a cavity constructed from mirrors that are perpendicular to the surface of the substrate. Unfortunately, this structure does not lend itself to low cost "mass" manufacturing or to the cost-effective fabrication of two-dimensional arrays of laser diodes.

These problems are overcome by a class of laser diodes that is fabricated such that the laser structure is perpendicular to the surface of the semiconductor wafer and the light is emitted perpendicular to the surface. These laser diodes are commonly known as Vertical Cavity Surface-Emitting Lasers (VCSELs). A VCSEL may be viewed as a laser having mirrors constructed from alternating layers of material having different indices of refraction. These lasers are better suited for the fabrication of arrays of lasers for displays, light sources, optical scanners, and optical fiber data links. Such lasers are useful in optical communication systems for generating the light signals carried by optical fibers and the like.

Compared to conventional edge-emitting semiconductor lasers, VCSELs have a number of desirable characteristics. The use of multi-layered DBR mirrors to form a cavity resonator perpendicular to the layers eliminates the need for the cleaving operation commonly used to create the cavity mirrors used in edge emitting lasers. The orientation of the resonator also facilitates the wafer-level testing of individual lasers and the fabrication of laser arrays.

To achieve high-speed operation and high fiber-coupling efficiency, it is necessary to confine the current flowing vertically in the VCSEL, and thus the light emission, to a small area. There are two basic prior art current confinement schemes for VCSELs. In the first scheme, a conductive aperture is defined by means of an ion-implanted, high-resistivity region in the semiconductor Distributed-Bragg-Reflector (DBR) mirror. Such a scheme is taught in Y. H. Lee, et al., Electr. Lett. Vol. 26, No. 11, pp. 710–711 (1990), which is hereby incorporated herein by reference. In this design, small ions (e.g. protons) are deeply implanted (e.g. 2.5 to 3 $\mu$m) in the DBR mirror. The implantation damage converts the semiconductor material through which the ions traveled to highly resistive material. Current is provided to the light generation region via an electrode that is deposited on the top surface of the VCSEL. To facilitate a low-resistance electrical contact through which light can also exit, an annular metal contact is deposited on the top-side of the device. The contact typically has an inner diameter smaller (e.g. by 4 to 5 $\mu$m) than the ion-implantation aperture in order to make contact with the non-implanted conducting area. As a result, a portion of the current-confined, light-emitting area is shadowed by the annular metal contact. The percentage of the current-confined, light-emitting area shadowed by the annular metal contact increases drastically as the size or diameter of the current-confined, light-emitting area decreases. This factor limits the smallest practical size of the current-confined area, and, therefore, limits the speed and light-output efficiency of this type of VCSEL.

In addition, ion-implanted VCSELs exhibit multiple spatial modes, which lead to a light-output-versus-current curve that often displays kinks due to the random and varying nature of the multiple spatial modes. This kinky light-output-versus-current behavior can produce a "noisy" waveform, and can degrade the performance of optical communication systems based on such designs. Prior art devices have been proposed to reduce the kinks in the light-output-versus-current characteristics by introducing additional structures in the light-emitting area; however, such solutions increase the cost and complexity of the devices.

In the second design, the current confinement aperture is achieved by generating a high-resistivity oxide layer embedded in the semiconductor DBR mirror. Such a scheme is taught in D. L. Huffaker, et al., Appl. Phys. Lett., vol. 65, No. 1, pp. 97–99 (1994) and in K. D. Choquette, et al., Electr. Lett., Vol. 30, No. 24, pp.2043–2044 (1994), both of which are incorporated herein by reference. In this design, an annular insulating ring having a conducting center is generated by oxidizing one or more layers of Al-containing material in the DBR mirror in a high-temperature wet Nitrogen atmosphere. The size of the oxide aperture is determined by the Al concentration of the Al-containing layers, the temperature, the moisture concentration of the oxidizing ambient, and the length of the oxidation time. The oxidation rate is very sensitive to all of these parameters, and hence, the oxidation process is not very reproducible. As a result, device yields are less than ideal. In addition, the oxidization process leads to stress within the device, which can further reduce yields.

Broadly, it is the object of the present invention to provide an improved VCSEL and method for making the same.

The manner in which the present invention achieves its advantages can be more easily understood with reference to the following detailed description of the preferred embodiments of the invention and the accompanying drawings.

SUMMARY OF THE INVENTION

Broadly, the present invention is a current confinement element that can be used in constructing light emitting devices. The current confinement element includes a top layer and an aperture-defining layer. The top layer includes a top semiconducting material of a first conductivity type that is transparent to light. The aperture-defining layer includes an aperture region and a confinement region. The aperture region includes an aperture semiconducting material of the first conductivity type that is transparent to light. The confinement region surrounds the aperture region and includes a material that has been doped to provide a high resistance to the flow of current. In one embodiment of the present invention, the confinement region includes a confinement semiconducting material of a second conductivity type. In another embodiment of the present invention the confinement region includes a material that has been doped with impurities that increase the resistivity of the material to a value greater than $5 \times 10^6$ ohm-cm. The aperture-defining layer is in electrical contact with the top layer such that current will flow preferentially through the aperture region relative to the confinement region when a potential difference is applied between the top and aperture defining layers.

The present invention can be used as part of a laser diode by utilizing part of one of the mirrors as the aperture-defining layer. A laser according to the present invention is fabricated by growing the layers in the conventional manner through the light emitting layer and first spacer layer. The first few layers of the top mirror are then grown. The device is then removed from the growth chamber, and the aperture region is masked. The unmasked area is then implanted or diffused with impurities to create the confinement region. The mask is then removed, and the device is returned to the growth chamber where the remaining mirror layers are fabricated in the conventional manner.

DETAILED DESCRIPTION OF THE PREFERRED EMBODIMENTS

Figure 1:
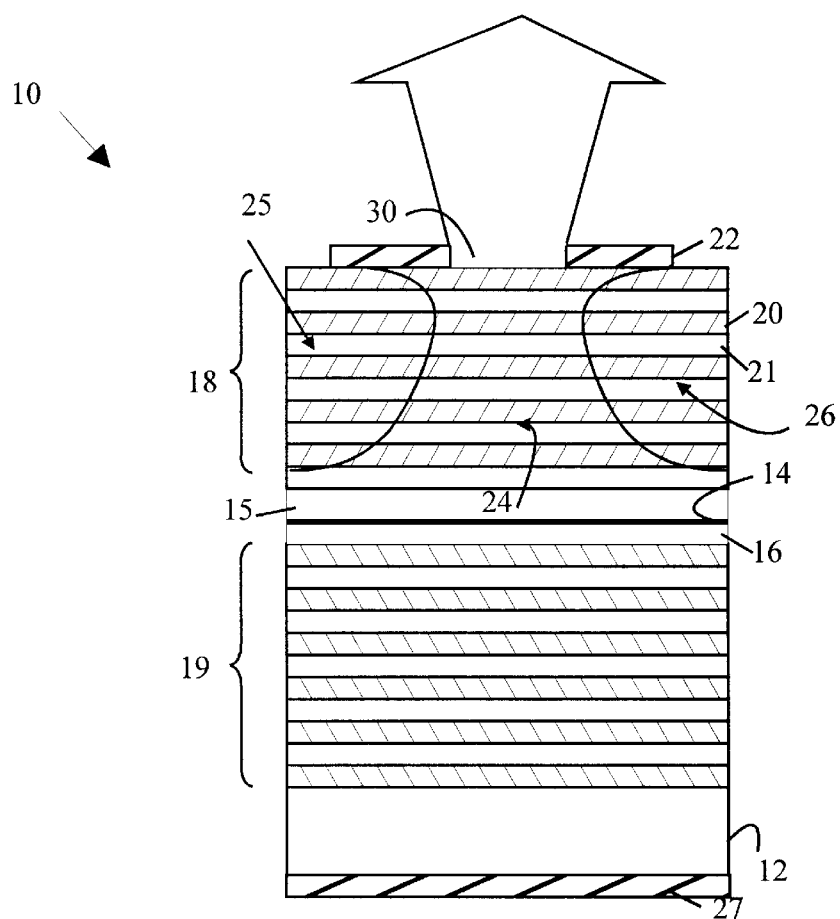
FIG. 1 is a cross-sectional view of a conventional ion-implanted VCSEL 10.

The present invention may be more easily understood with reference to FIG. 1, which is a cross-sectional view of a conventional VCSEL 10. Since construction of VCSELs is well known to those skilled in the laser arts, it will not be described in detail here. For the purposes of this discussion, it is sufficient to note that VCSEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth. Substrate 12 is an n-type semiconductor in the example shown in FIG. 1.

The active region is typically constructed from a layer having one or more quantum wells of InGaAs, GaAs, AlGaAs, InGaAsN, or InAlGaAs that is separated from mirror regions 18 and 19 by spacers 15 and 16, respectively. The choice of material depends on the desired wavelength of the light emitted by the VCSEL. In addition, devices based on bulk active regions are known to the art. This layer 14 may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light that is to be output by the VCSEL. The stacked layers form Bragg mirrors. The stacks are typically constructed from alternating layers of AlAs or AlGaAs and GaAs or AlGaAs of lower Al concentration. The layers in the upper mirror region 18 are typically doped to be p-type semiconductors and those in the lower mirror region 19 are doped to be n-type semiconductors. Substrate 12 is preferably an n-type contact. Bottom electrode 27 is preferably an n-ohmic contact. However, n-i-p diode structures may also be constructed by growing the structures on a p-substrate or a semi-insulating substrate with a p-layer deposited thereon.

In one of the prior art designs discussed above, the current flow between electrodes 22 and 27 is confined to region 24 by implanting regions 25 and 26 to convert the regions to regions of high resistivity. This is typically accomplished by implanting with hydrogen ions. To provide sufficient current through the light generating region, electrode 22 must extend over the light generating region to some degree. As noted above, this overlap can cause a significant reduction in device efficiency in small VCSELs.

Figure 2:
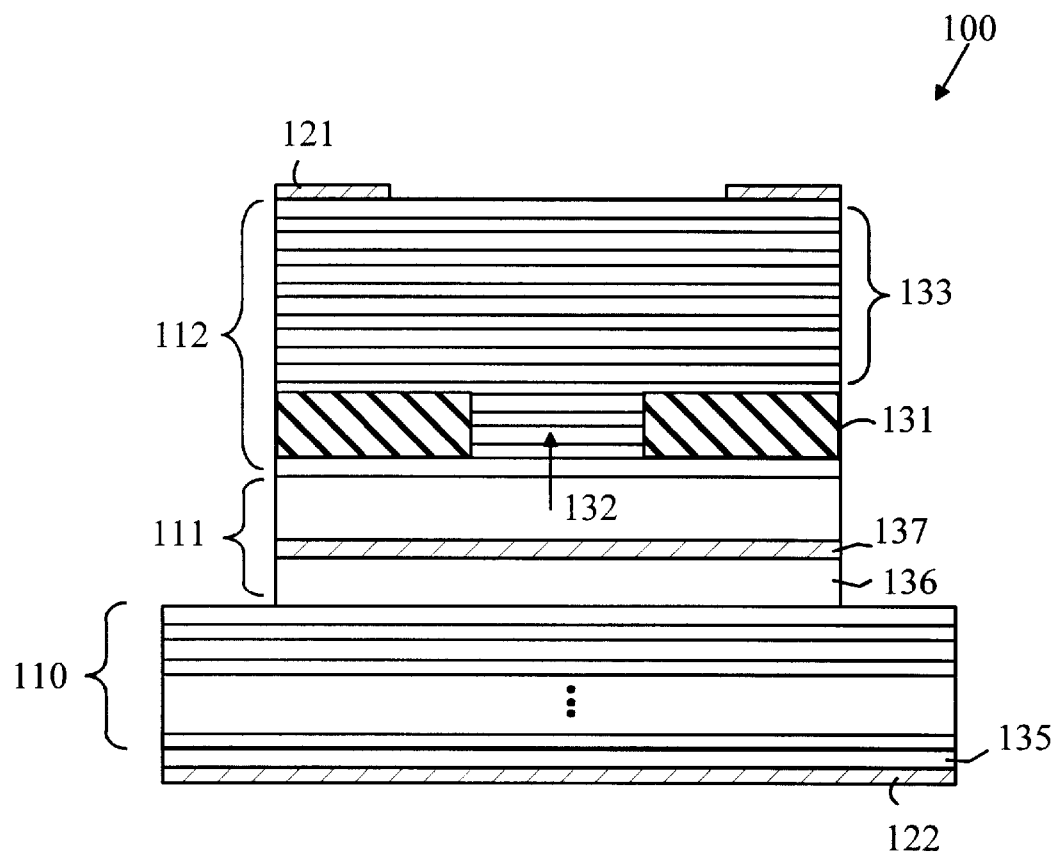
FIG. 2 is a cross-sectional view of a VCSEL 100 according to one preferred embodiment of the present invention.

Refer now to FIG. 2, which is a cross-sectional view of a VCSEL 100 according to one preferred embodiment of the present invention. VCSEL 100 utilizes a buried current confinement structure, which enables VCSEL 100 to have a higher output light efficiency and is better suited to VCSELs having a small emission area. VCSEL 100 is similar to VCSEL 10 discussed above in that VCSEL 100 has a bottom mirror region 110, a light generation region 111, and a top mirror region 112. The mirror regions are Bragg reflectors and are constructed by epitaxial growth of the alternating layers described above. VCSEL 100 is also a p-i-n diode that is forward biased by applying a potential between electrodes 121 and 122. The bottom mirror layers are preferably grown on a buffer layer 135 of the same conductivity type as the bottom mirror layers. The active region 111 includes a spacer layer 136 of the same conductivity type as the bottom mirror layers. The active region also includes a light emitting layer 137, and a second spacer having the opposite conductivity type, i.e., the conductivity of the type of materials used for the upper mirror 112.

Current confinement is provided by a buried annular region 131 that restricts current flow to the center 132 of the annulus. The manner in which this current confinement region is constructed will be discussed in detail below. It should be noted that the buried nature of the confinement structure leaves the region 133 between electrode 121 and region 131 in a conducting state. Accordingly, region 133 can provide a current spreading function, and hence, electrode 121 does not need to overlap the current conducting portion of region 131.

In the preferred embodiment of the present invention the reflectivity of the mirror layers in region 131 is less than that of the mirror layers in region 132. The resultant VCSEL has been found to exhibit a smoother light output versus current curve.

Figure 3A:
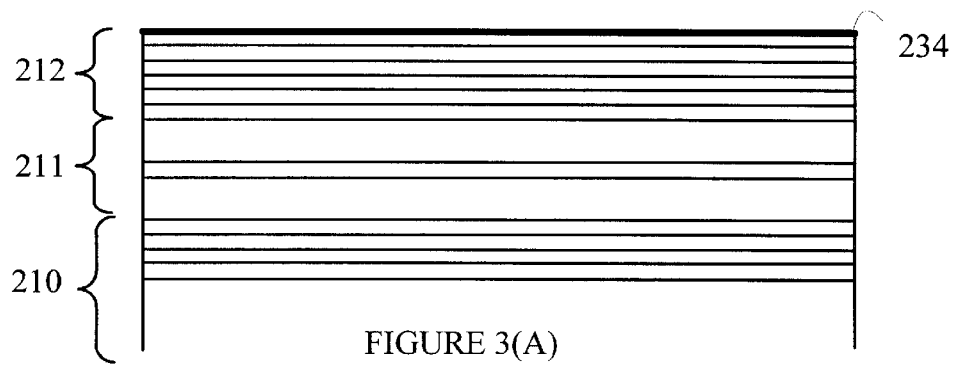
FIGS. 3(A)–3(E) are cross-sectional views of a VCSEL according to the present invention at various stages in the fabrication process.

In the preferred embodiment of the present invention, the current-channeling structure is formed by ion-implantation or diffusion of species into one or more of the layers that make up the top mirror. Refer now to FIGS. 3(A)–3(E), which are cross-sectional views of a VCSEL according to the present invention at various stages in the fabrication process. The various layers needed to provide the bottom mirror 210, active region 211, the first few layers of the top mirror 212 and a thin GaAs cap layer 234 are first fabricated in the conventional manner as shown in FIG. 3(A). The GaAs cap layer is in the order of 50–100 Å thick and is positioned at one of the nulls of the optical field in the optical cavity. This arrangement minimizes the absorption of the light by this GaAs layer while protecting the underlying layers of the structure from oxidation.

Figure 3B:
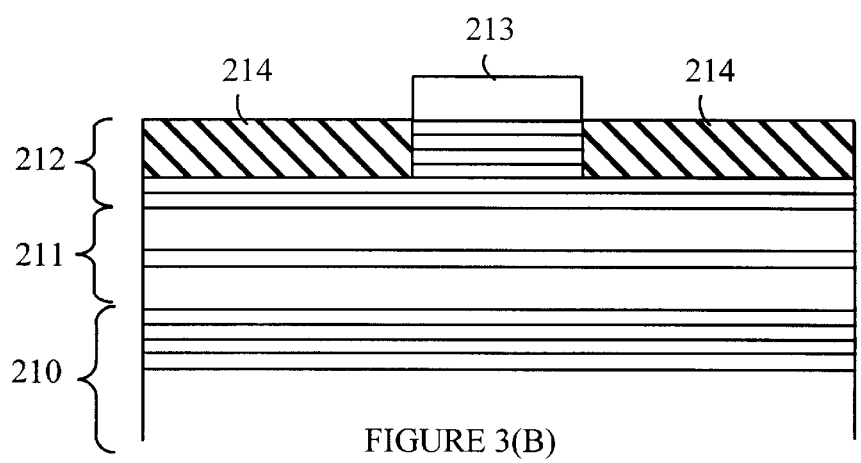

The wafer on which the layers have been deposited is then removed from the epitaxial growth chamber. A mask 213 is then generated over the region that is to become the aperture of the current-channeling structure. The mask is preferably generated by conventional lithographic techniques. The wafer is then implanted or diffused with atomic species to provide the current-confinement regions 214 as shown in FIG. 3(B). The particular species utilized will be discussed in more detail below.

Figure 3C:
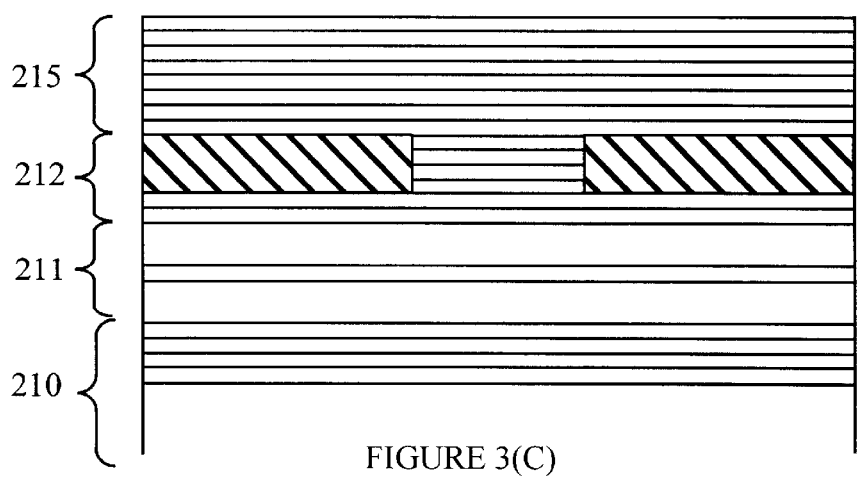

After the introduction of the doping species, the mask is removed and the remaining layers 215 of the top mirror are deposited as shown in FIG. 3(C). The implanted or diffused area must be preserved during the high temperature exposure of the altered region that is encountered during the growth of the remaining mirror layers.

Figure 3D:
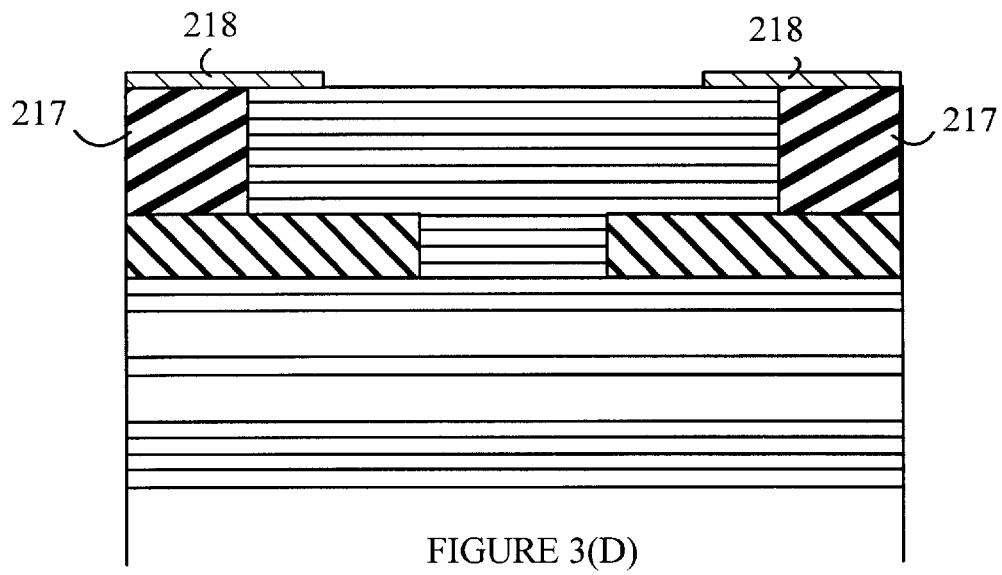
Figure 3E:
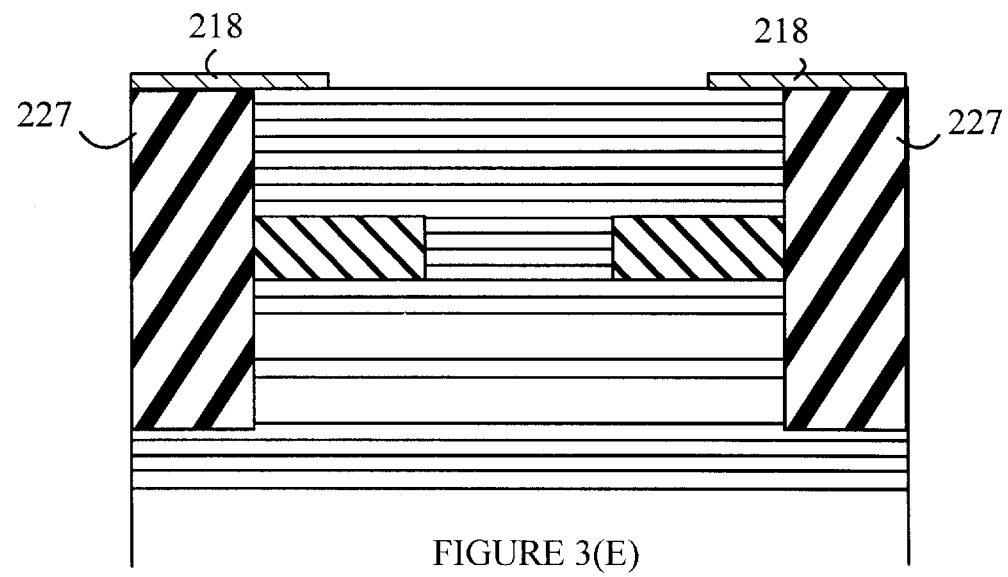

After the deposition of the remaining layers 215 of the top mirror, a high resistive region 217 as shown in FIG. 3(D) may be created by an aggregated implantation to reduce the parasitic capacitance of the VCSEL under its top metal contact and bonding pad. If the individual VCSELs are part of an array in which the members are not isolated by cutting a trench between the members of the array, this aggregated implantation should be extended to beyond the light emitting layer to provide isolation of the individual VCSELs as shown at 227 in FIG. 3(E). The isolation implant is constructed by masking the surface of the top mirror and then implanting the unmasked region with hydrogen ions to render the region non-conducting, or at least highly resistive. Since the isolation implant does not define the current confinement region in the device, the isolation implant does not need to extend over the aperture in the current-channeling structure. Hence, the problems discussed above with respect to such implants are not encountered in the present invention.

Finally, the top contact, which includes electrode 218, is deposited. This contact may include a grading layer and contact layers of the same conductivity type as the upper mirrors in addition to the metallic electrode. It should be noted that the top electrode does not need to extend over the region defined by the aperture in the current-channeling structure, since the mirror layers below the electrode are electrically conducting, and hence provide a current spreading function. The top electrode only needs to extend beyond the current of the optional isolation implant discussed above.

The specific implants or diffusion species will now be discussed in more detail. To simplify the following discussion, the term "implant" shall be deemed to include the introduction of a species either by bombardment at an appropriate energy or by diffusion of the species into the material. The implanted region must present a very high resistance path compared to the material in the aperture of the current-channeling structure. One method for accomplishing this goal is to alter the resistivity of the material outside of the aperture. Examples of implant species for generating such a high-resistivity region are O, Ti, Cr, or Fe; other species will be apparent to those skilled in the art. In the preferred embodiment of the present invention, the high-resistivity layer has a resistivity greater than $5\times10^6$ ohm-cm.

A second method for generating a high resistance current path is to implant the region with species that change the conductivity-type to the opposite conductivity, thereby generating a reversed-biased diode outside of the current-defining aperture. For example, if the region to be implanted is initially a p-type material, the material in the implant region can be converted to an n-type material by implanting the region with Si, Ge, S, Sn, Te, Se or other species that render the region n-type. If the material in the implant region is initially an n-type material, C or Be may be implanted to render the region p-type.

It should be noted that the aperture of the current-channeling structure may also be formed by ion-implantation or diffusion of a combination of species which form a region of high-resistivity and/or a region of opposite-type conductivity from the original material. In all cases, either or both of the high-resistivity region or the region of opposite-type of conductivity, may be created using a plural number of implant energies and/or dosages. It has been found experimentally that the characteristics of high-resistivity or opposite-type of conductivity provided by the above-described implants are preserved through the high temperature processes that are required to grow the remaining portion of the top DBR mirror.

The embodiments of the present invention discussed above utilize a circular annulus for the current-defining aperture. However, it will be obvious to those skilled in the art from the preceding discussion that other shapes may be utilized for the current confinement aperture. In contrast to oxide VCSELs, the shape of the aperture in the present invention is determined by a lithographic mask, and hence, the designer is free to chose any shape aperture. Since the aperture determines the cross-section of the resultant light signal, the present invention provides additional advantages over oxide VCSELs.

The embodiments of the present invention described above have referred to top and bottom mirrors, etc. However, it will be obvious to those skilled in the art from the preceding discussion that these terms are convenient labels and do not imply any particular spatial orientation.

The energy and dosage of implantation depends on the species used and the concentration of the dopants in the first few pairs of layers of the top DBR mirror. As an example, for a typical doping concentration of $10^{18}$ cm$^{-3}$ of the top DBR mirror, an implant energy of 300 KeV and dose of about $5\times10^{14}$ cm$^{-2}$ may be employed for Si. Different implantation energies may be used for other atom species to place the implanted region at the desirable depth. Si may also be introduced by solid state diffusion. The diffusion temperature and time are chosen to provide the desirable depth. For example, diffusion at a temperature above 700° C. for a few hours can be utilized for Si.

In principle, the current-channeling structure can be constructed in either mirror; however, in the preferred embodiment of the present invention, the structure is formed in the p-type DBR mirror because it provides better current confinement. If the current-channeling structure is on the n-side, current tends to spread out between the current-channeling structure and the active region, due to the higher conductivity of an n-type AlGaAs semiconductor. In addition, it is advantageous to grow the active light-emitting layer on as high a quality semiconductor surface as possible. If the current-channeling structure is constructed in the n-type mirrors prior to the deposition of the active region, the active region must be grown on a surface that has been subjected to masking, implantation, etc. These processes will, in general, reduce the quality of the semiconductor surface, and hence, much greater care must be taken in fabricating the current-channeling structure if it is to be under the active layer.

Various modifications to the present invention will become apparent to those skilled in the art from the foregoing description and accompanying drawings. Accordingly, the present invention is to be limited solely by the scope of the following claims.

What is claimed is:

1. A method for fabricating a light-emitting device, said method comprising the steps of:
    depositing a first semiconducting layer of a first conductivity type;
    depositing a light-emitting layer on said first semiconducting layer;
    depositing a second semiconducting layer of a second conductivity type on said light-emitting layer;
    depositing an aperture defining layer on said second semiconducting layer, said aperture defining layer comprising a semiconducting material of said second conductivity type;

defining an aperture region in said aperture defining layer;

implanting an area around said aperture region with impurities to create a current-blocking region, said aperture region remaining free of said impurities; and depositing a third semiconducting layer of said second conductivity type on said second semiconducting layer after said implanting step.

2. The method of claim 1 wherein said impurities convert said semiconducting material of said aperture defining layer to said first conductivity type.

3. The method of claim 2 wherein said impurities comprise an element chosen from the group consisting of C, Be, Si, Ge, S, Sn, Te, and Se.

4. The method of claim 1 wherein said impurities convert said semiconducting material of said aperture defining layer to a material having a resistivity greater than $5 \times 10^6$ ohm-cm.

5. The method of claim 4 wherein said impurities comprise an element chosen from the group consisting of O, Cr, Ti, and Fe.

6. The method of claim 1 wherein said impurities comprise an element chosen from the group consisting of O, Cr, Ti, and Fe.

7. The method of claim 1 wherein said first semiconducting layer comprises a plurality of sub-layers forming a DBR mirror.

8. A method for fabricating a light-emitting device, said method comprising the steps of:

depositing a first semiconducting layer of a first conductivity type;

depositing a light-emitting layer on said first semiconducting layer;

depositing a second semiconducting layer of a second conductivity type on said light-emitting layer;

depositing an aperture defining layer on said second semiconducting layer, said aperture defining layer comprising a semiconducting material of said second conductivity type;

defining an aperture region in said aperture defining layer;

implanting an area around said aperture region with impurities to create a current-blocking region, said aperture region remaining free of said impurities; and depositing a third semiconducting layer of said second conductivity type on said second semiconducting layer after said implanting step, wherein said aperture defining layer comprises a plurality of sub-layers forming a portion of a DBR mirror, said third semiconducting layer comprising another portion of said DBR mirror.

* * * * *